(12) United States Patent
Rzittka

(10) Patent No.: US 6,710,619 B2
(45) Date of Patent: Mar. 23, 2004

(54) INTEGRATED CIRCUIT WITH PROGRAMMABLE LOCKING CIRCUIT

(75) Inventor: Eckart Rzittka, Wildberg-Sulz (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/115,781

(22) Filed: Jul. 14, 1998

(65) Prior Publication Data
US 2003/0046480 A1 Mar. 6, 2003

(30) Foreign Application Priority Data
Jul. 22, 1997 (DE) .......................... 197 31 406

(51) Int. Cl.$^7$ .......................... G11C 16/12; G06F 12/14
(52) U.S. Cl. .................... 326/37; 711/103; 365/185.04; 365/185.05
(58) Field of Search ................. 711/103, 102, 711/152, 163; 713/200; 326/8, 37, 38; 365/96, 185.04, 185.05, 185.07

(56) References Cited

U.S. PATENT DOCUMENTS

| | | | |
|---|---|---|---|
| 5,175,840 A | | 12/1992 | Sawase et al. ............... 711/103 |
| 5,264,742 A | * | 11/1993 | Sourgen ....................... 326/37 |
| 5,345,413 A | * | 9/1994 | Fisher et al. .................. 365/96 |
| 5,357,572 A | * | 10/1994 | Bianco et al. ............... 713/193 |
| 5,606,523 A | * | 2/1997 | Mirabel .................. 365/185.05 |
| 5,682,031 A | * | 10/1997 | Geronimi ..................... 235/492 |
| 5,941,987 A | * | 8/1999 | Davis .......................... 713/200 |

OTHER PUBLICATIONS

Patterson, et al., "Computer Organization and Design—The Hardware/Software Interface", 1994, pp. B–21—B–25.*
Mano, Morris, "Digital Design", Prentice–Hall, 1984, pp. 204–210.*

* cited by examiner

Primary Examiner—Gary Portka
(74) Attorney, Agent, or Firm—Kevin Simons

(57) ABSTRACT

In order to preclude unauthorized access to a memory, for example after testing, two EEPROM cells are programmed and their outputs are subjected to a logic operation, the result being stored in a memory element and being evaluated. The cells are arranged in such a manner that they are programmed together in anti-parallel. A well-defined initial condition before a test is established by changing the control gate voltage, which causes both cells to be set to an initial state with similar output signals. The initial state is stored in the storage element and is evaluated. It is not until the initial condition has been established that the EEPROM cells are programmed and the correct programming is tested.

Locking is effected by means of a single programming pulse and is irreversible.

7 Claims, 1 Drawing Sheet

INTEGRATED CIRCUIT WITH PROGRAMMABLE LOCKING CIRCUIT

The invention relates to an integrated circuit with a programmable locking circuit for the generation of an irreversibly changed switching signal after programming, comprising at least two EEPROM cells whose output signals produce the switching signal after an EXOR operation.

The data-file security in integrated circuits is protected by means of locking circuits. It is ensured that after programming no data can be read from the integrated circuit or can be manipulated therein.

From U.S. Pat. No. 5,175,840 an arrangement is known by means of which EEPROM cells can be tested and unauthorized access to the cells can be inhibited. The external data exchange is controlled via a security signal. In one state of the security signal external reading and writing of data is possible. The inverse state prevents the external data exchange. A first condition defining the state of the security signal is derived from the states of security EEPROM cells. When the states of these security EEPROM cells are all identical the security signal assumes a state, after an ENOR operation, which enables the external data exchange. Identical states of these cells occur only if previously all the cells have been erased or set. These states can be set externally. A second condition permanently sets the security signal in such a manner that an external data exchange is no longer possible. If one condition is fulfilled or if both conditions are fulfilled the security signal assumes a state in which no external data exchange is possible.

When the security signal allows an external data exchange the arrangement is in a test mode in which the data of the EEPROM cells can be read and rewritten from outside.

The security signal can be inverted as long as the erase and write modes for the security EEPROM cells can be set externally, as a result of which the security signal can also be inverted by non-authorized persons when the structure and programs are known. It is not until a specific external program voltage has been applied to a given terminal that the security signal becomes non-invertible and the EEPROM data in the integrated circuit can no longer be changed from outside. When this voltage is not applied the arrangement remains in a state in which the security signal can be reset.

It is the object of the invention to provide a locking circuit which generates a switching signal which is no longer invertible.

In an integrated circuit with a programmable locking circuit of the type defined in the opening paragraph this object is achieved in that the EEPROM cells are only programmable at the same time in such a manner that one cell is written in and another cell is erased.

For this purpose, the arrangement is based on an initial condition in which the EEPROM cells have not yet been programmed and have identical states. In this initial condition the switching signal can be set by means of a programming pulse so as to assume a state which is a locked state. In this respect, it is to be emphasized that it is merely required to program and the programming result is unambiguously defined by the cell arrangement. After programming, a change of the control gate voltage does neither allow restoring of the initial condition, in which the cells still have the same non-shifted and fabrication-related threshold voltage, nor inversion of the switching signal, by means of which locking is to be effected.

Embodiments of the invention will be described in more detail hereinafter, by way of examples, with reference to the drawings. In the drawings.

Figure 1:
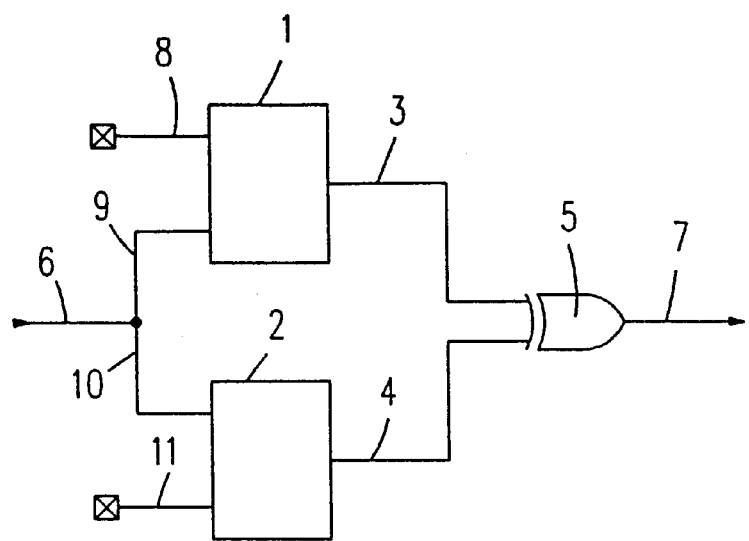
FIG. 1 is a block diagram illustrating the operating principle.

The block diagram of FIG. 1 shows two programmable cells 1 and 2 in anti-parallel having their outputs 3 and 4 connected to an EXOR gate 5. The two cells are connected to the programming input 6 in such a manner that only the write input 9 of the cell 1 and only the erase input 10 of the cell 2 are connected. The respective other inputs 8 and 11, i.e. the erase input 8 of the cell 1 and the write input 11 of the cell 2, are not connected. The switching signal 7 appears on the output of the EXOR. Owing to this method of connecting the cells a "1" appears on the output 7 after the first programming pulse and the circuit to be protected, which is not shown, is locked in an irreversible manner.

Figure 2:
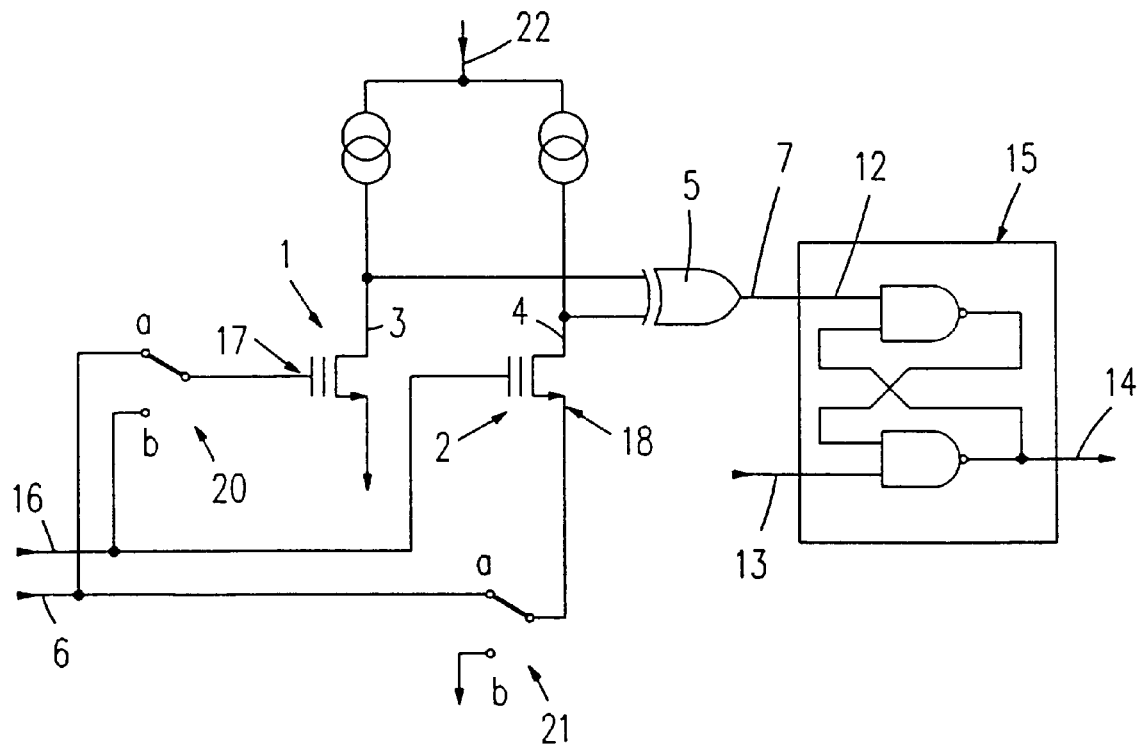
FIG. 2 is a circuit diagram of the locking circuit in accordance with the invention.

FIG. 2 shows a possible implementation of this locking circuit. It comprises two EEPROM cells 1 and 2 whose drains, which constitute the outputs 3 and 4, are energized with a supply voltage VDD 22 and are connected to the inputs of the EXOR 5. In switch position a two switches 20 and 21 connect the gate 17 of the cell 1 and the source 18 of the cell 2 to the programming input 6. In switch position b the gate 17 of the cell 1 is connected to the control gate voltage 16 and the source 18 of the cell 2 is connected to the reference potential. The output 7 of the EXOR 5 is the set input 12 of the flip-flop 15. The flip-flop is realized by means of NAND gates and has an output 14. The reset input 13 is connected to a power-up signal.

In the non-programmed condition two identically constructed adjacent EEPROM cells have substantially the same, fabrication-related, threshold voltage and they supply equal output signals, which are applied to the EXOR and produce a zero on the output of the EXOR. This condition is the initial condition. This can be verified by applying a read voltage of 3 V to the control gates. The threshold voltages of both cells could lie exactly at the switching point, while in the non-programmed conditions the cells supply different output signals. To do this would result in a "1" on the output of the EXOR and would represent a locked condition. In order to preclude this, the above-mentioned initial condition is established. For this purpose, the switches 20 and 21 are set to position b and the control gate voltage 16 of the memory cells changes. Since the threshold voltage also changes as a result of the coupling factor between the control gate and floating gate, the control gate voltage is switched, for example, from 3 V to 1 V in order to shift the threshold voltage so far that a range with equal output signals for both cells is passed through. This initial condition must be brought about in a reliable manner. The initial condition is represented by a "0" output of the EXOR and is buffered in the flip-flop 15. Buffering of this switching signal 7 in the flip-flop 15 is required particularly in the case that the memory cells 1 and 2 are accessed by addressing and the switching signal is not permanently available on the output of the EXOR 5.

Programming is effected after the initial condition for the cells has been verified or established, i.e. a "0" appears on the output 14. The initial condition, represented by a "0" on the output 14, is maintained until the flip-flop 15 is reset by a power-up signal via the reset input 13 when the supply voltage is turned on again, because after programming of the cells 1 and 2 the EXOR 5 always a "1" appears on the output 7 and the set input 12 and, consequently, the flip-flop 15 can no longer be reset to "0".

In the programming mode a programming pulse is applied to the gate 17 of the cell 1 and to the source 18 of the other cell 2. As a result of this, the cells are programmed oppositely. Cell 1 is loaded and cell 2 is erased.

In addition to this programming mode, characterized by the switch position a in FIG. 2, there is a read mode. In this read mode both cells are driven in the same way, for which purpose the switches 20 and 21 should be set to position b. In this read mode the stability of the states of the cells after application of a programming pulse can be checked by reading the programmed states. The states of the EEPROM cells are normally read with a voltage of 3 V. In order to preclude any indifferent states modified read voltages are used in order to ascertain whether the cells retain their programmed states with the corresponding output signals. To this end, voltages of 5 V and 0 V are applied to the control gates of the cells. Cell 1 has been written in and is driven with 0 V in order to check whether the cell retains its output signal. A voltage of 0 V on the erased cell 2 does not produce any change. Cell 2 is driven with 5 V. The output signal of the cell should be maintained. A voltage of 5 V does not cause a change of the output signal of the written-in cell 1. Testing is effected after programming and before the power is turned off.

After a programming pulse has been applied and the supply voltage has been turned on again locking is achieved because the flip-flop 15 now always produces a "1" on the output 14. The output 14 can be reset to "0" only by a "0" on the set input, which cannot occur any longer.

The advantage of this locking circuit is that the switching signal can no longer be inverted once a programming pulse has been applied. Upon each new programming operation the locked condition is maintained because the switching signal on the EXOR is again "1" and the switching signal on the output 14 also indicates a locked condition after the flip-flop has been reset.

Testing of the stability of the programmed states guarantees an additional security of the locking circuit.

What is claimed is:

1. A programmable memory circuit, comprising:
    a mode select circuit coupled to switch the programmable memory circuit between an initialization mode and a programming mode and including:
        a first switch having a first terminal coupled to receive a control signal and a second terminal coupled to receive a program signal; and
        a second switch having a first terminal coupled to receive the program signal;
    a memory cell coupled to the mode select circuit, wherein a first logic level is generated at an output of the memory cell in response to the initialization mode and a second logic level is generated at the output of the memory cell in response to the programming mode; and
    a buffer coupled to the memory cell to maintain the first and second logic levels at substantially constant values.
2. The programmable memory circuit of claim 1, wherein the first switch further comprises an output terminal coupled to provide the control signal to a control terminal of the memory cell during the initialization mode and coupled to provide the program signal to the control terminal of the memory cell during the programming mode.
3. The programmable memory circuit of claim 2, wherein the second switch further comprises an output terminal coupled to provide the program signal to a conduction terminal of the memory cell during the programming mode.
4. A programmable memory circuit, comprising:
    a mode select circuit coupled to switch the programmable memory circuit between an initialization mode and a programming mode;
    a memory cell coupled to the mode select circuit, wherein a first logic level is generated at an output of the memory cell in response to the initialization mode and a second logic level is generated at the output of the memory cell in response to the programming mode and including:
        a first conduction control device having a control terminal coupled to receive a control gate voltage from the mode select circuit to place the first conduction control device into a first conductive state during the initialization mode; and
        a second conduction control device having a control terminal coupled to receive the control gate voltage from the mode select circuit to place the second conduction control device into the first conductive state during the initialization mode; and
    a buffer coupled to the memory cell to maintain the first and second logic levels at substantially constant values.
5. The programmable memory circuit of claim 4, wherein the control terminal of the first conduction control device is further coupled to receive a programming voltage from the mode select circuit to maintain the first conduction control device in the first conductive state during the programming mode.
6. The programmable memory circuit of claim 5, wherein the second conduction control device further comprises a conduction terminal coupled to receive the programming voltage from the mode select circuit to maintain the second conduction control device in a second conductive state during the programming mode.
7. A programmable memory circuit comprising:
    mode select circuit means for switching the programmable memory circuit between an initialization mode and a programming mode;
    memory cell means for generating a first logic level at an output of the memory cell in response to the initialization mode, and for generating a second logic level at the output of the memory cell in response to the programming mode; and buffer means for maintaining the first and second logic levels at substantially constant values.

* * * * *